United States Patent [19]

Ooga

[11] Patent Number: 5,554,987
[45] Date of Patent: Sep. 10, 1996

[54] DIRECT DIGITAL SYNTHESIZER CAPABLE OF REDUCING SPURIOUS NOISE COMPONENTS

[75] Inventor: Toshiyuki Ooga, Tokyo, Japan

[73] Assignee: NEC Corporation, Japan

[21] Appl. No.: 200,750

[22] Filed: Feb. 23, 1994

[30] Foreign Application Priority Data

Feb. 24, 1993 [JP] Japan .................................. 5-033864

[51] Int. Cl.$^6$ .................................................. H03M 1/66
[52] U.S. Cl. ........................................... 341/147; 364/721
[58] Field of Search ................................... 341/115, 117, 341/147, 144; 364/721

[56] References Cited

U.S. PATENT DOCUMENTS

| | | | |
|---|---|---|---|
| 4,134,072 | 1/1979 | Bolger | 328/14 |
| 4,809,205 | 2/1989 | Freeman | 364/721 |
| 4,901,265 | 2/1990 | Kerr et al. | 364/721 |
| 4,933,674 | 6/1990 | Gasperi et al. | 341/116 |
| 4,951,237 | 8/1990 | Essenwanger | 364/721 |
| 4,975,699 | 12/1990 | Frey | 341/118 |
| 5,039,987 | 8/1991 | Ohtsuka | 341/111 |
| 5,291,428 | 3/1994 | Twitchell et al. | 364/602 |
| 5,321,642 | 6/1994 | Goldberg | 364/721 |

*Primary Examiner*—Marc S. Hoff
*Attorney, Agent, or Firm*—Ostrolenk, Faber, Gerb & Soffen, LLP

[57] ABSTRACT

A direct digital synthesizer (DDS) 3 comprises a phase accumulator for generating phase data in response to frequency data, periodic signal converters for generating a sine signal and a cosine signal in response to the upper bits of the phase data, phase error signal generating means for generating a phase error signal in response to the lower bits of the phase data, a multiplier for multiplying the cosine signal and the phase error signal to produce a spurious cancel signal, and a subtracter 35 for subtracting the spurious cancel signal from the sine signal, thereby obtaining a resultant sine signal free from spurious noise.

6 Claims, 4 Drawing Sheets

5,554,987

DIRECT DIGITAL SYNTHESIZER CAPABLE OF REDUCING SPURIOUS NOISE COMPONENTS

BACKGROUND OF THE INVENTION

The present invention relates to a direct digital synthesizer (DDS) and, more particularly, to a DDS capable of reducing spurious noise components contained in output signal thereof.

FIG. 1 shows a schematic diagram of a conventional DDS. As shown, a DDS 3C has a phase accumulator 31 which receives a clock signal S1 from a reference frequency oscillator 1 and receives phase increment data (referred to as frequency data hereinafter) of a constant a (1 or greater integer) from a frequency data setting circuit. The phase accumulator 31 has an adder 311 which adds, in synchronism with the clock signal S1, the constant a to phase data S31 delivered from itself. Namely, the adder 311 integrates, or accumulates, the constants a in accordance with the elapse of time, thereby outputting the phase data S31. When the cumulative value of the phase data S31 overflows, i.e., increases above the counting limit of the adder 311, the adder 311 omits a carry bit due to the overflow and then repeats the phase data accumulation. Therefore, the phase data S31 has a saw-tooth waveform and corresponds to a sine signal S33a, which will be described later.

The upper (most significant) bits 31a of the phase data S31 are applied to a phase-to-amplitude converter 32A as an address signal. Generally implemented by a ROM (Read Only Memory), the phase-to-amplitude converter 32A generates waveform data 32a representative of sine-amplitude data. A digital-to-analog (D/A) converter 33A transforms the amplitude data S32 into a sine signal S33a (S3a). When the constant a is 1, the DDS 3C generates the sine signal S3a having a basic frequency $f_o$. As the constant a changes, the DDS 3C sequentially generates sine signal S3a having a frequency ($a \times f_o$). The DDS 3C has been known in the art as an oscillator having a minimum phase noise in the vicinity of carrier frequency and, in addition, being capable of changing frequency rapidly.

However, the prior art DDS has the drawback of spurious noises in its output in accordance with the accumulation operation of the adder 311. The first spurious noise is caused by overflow occurring on the entire bit length of the adder 311 due to residual accumulation. In this case, the residual is derived when offset accumulation overflows. This causative overflow has periodicity associated with the constant a. Since the phase data S31 corresponds to the phase of the sine signal S33a, the causative overflow effects a undesirable instantaneous phase deviation of the signal S33a. Therefore, the sine signal S33a contains spurious noise having frequency reciprocal of the overflow periodicity.

The second spurious noise is caused by overflow occurring when a carry is generated from the lower (lest significant) bit portion, which is not supplied to the phase-to-amplitude converter 32A as the address signal, to the significant bit portion of the address signal. In the DDS, though the least significant bits of the adder 311 are not used for the address signal of the phase-to-amplitude converter 32A, overflow (a carry) due to offset accumulation in the least significant bit portion is applied to the address signal of the converter 32A. This overflow also has periodicity associated with the constant a and causes the spurious noise.

Furthermore, when the offset value is accumulated and the cumulative offset value overflows, residual (high order offset) also remains in accordance with the constant a. Thus, accumulation of this residual produces further overflow. Such overflow also causes a third spurious noise (high order spurious noise).

To reduce the first spurious noise described above, there is a method of adding a pseudorandom number to the least significant bit of the adder, thereby disturbing the periodicity of the overflow. This method is disclosed in U.S. Pat. No. 4,951,237 entitled "DIRECT DIGITAL SYNTHESIZER WITH SELECTABLY RANDOMIZED ACCUMULATOR". However, though this method can reduce the spurious noise, it introduces another spurious noise due to the addition of the pseudorandom number. Another method of reducing spurious noise is also disclosed in U.S. Pat. No. 4,901,265 entitled "PSEUDORANDOM DITHER FOR FREQUENCY SYNTHESIS NOISE". In this method, a small pseudorandom numbers are added to sine amplitude data delivered from a sine converter. However, this method also introduces another spurious noise due to the addition of the pseudorandom number.

SUMMARY OF THE INVENTION

It is, therefore, an object of the present invention to provide a DDS capable of eliminating spurious noise due to the overflow of an adder (phase accumulator).

In accordance with the present invention, a DDS comprises phase accumulator for accumulating frequency data in synchronism with a clock signal to thereby produce phase data, a phase-to-sine signal converter for generating a sine signal in response to significant bits of the phase data and the clock signal, a phase-to-cosine signal converter for generating a cosine signal, which is advanced by 90° in phase relative to the sine signal, in response to the significant bits and the clock signal, a converter for converting at least a part of the less significant bits of the phase data into a phase error signal, a multiplier for multiplying the cosine signal and the phase error signal to produce a spurious cancel signal, and a subtracter for subtracting the spurious cancel signal from the sine signal to produce a resultant sine synthesized signal.

DESCRIPTION OF THE EMBODIMENTS

Figure 1:
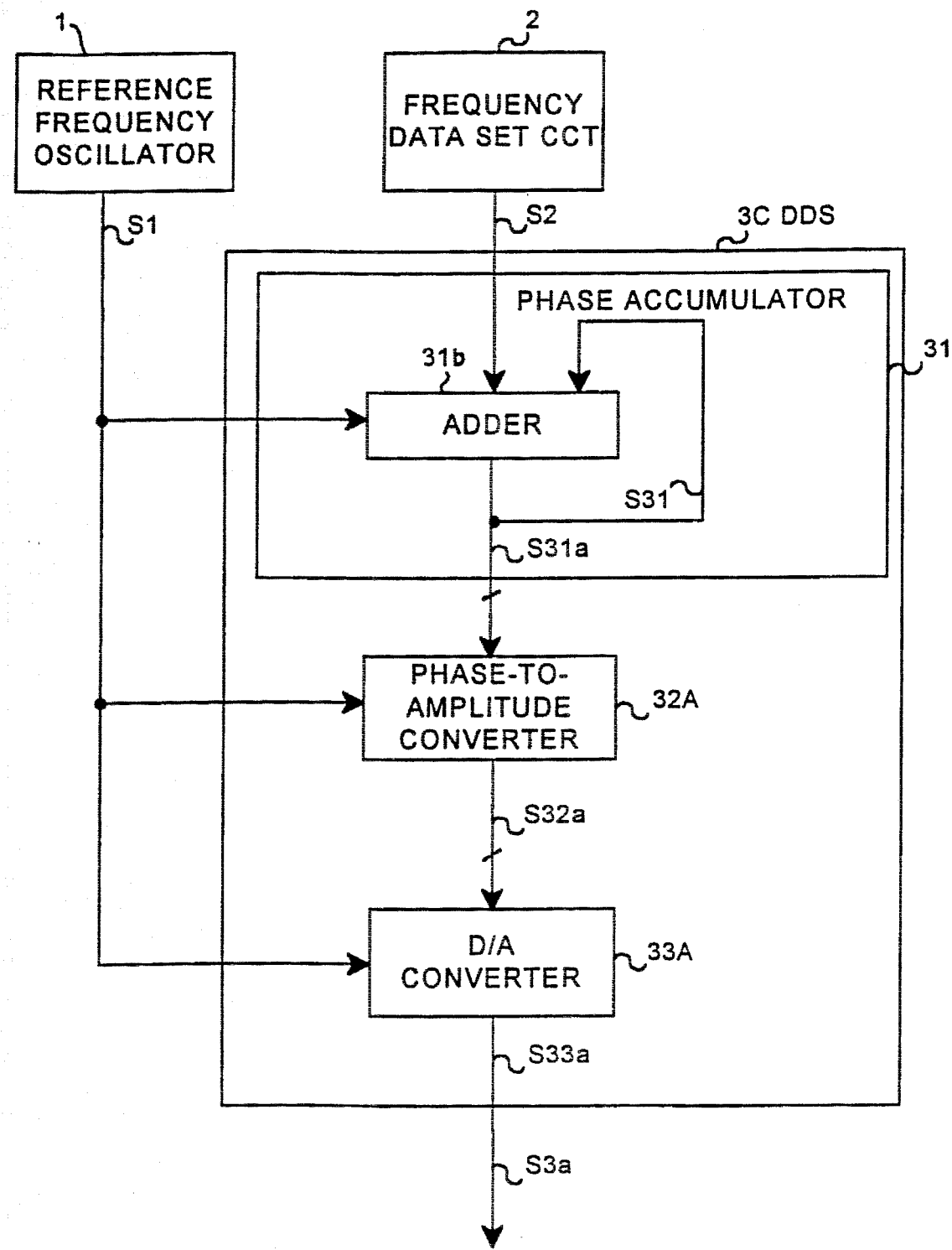
FIG. 1 is a block diagram schematically showing a conventional DDS.
Figure 2:
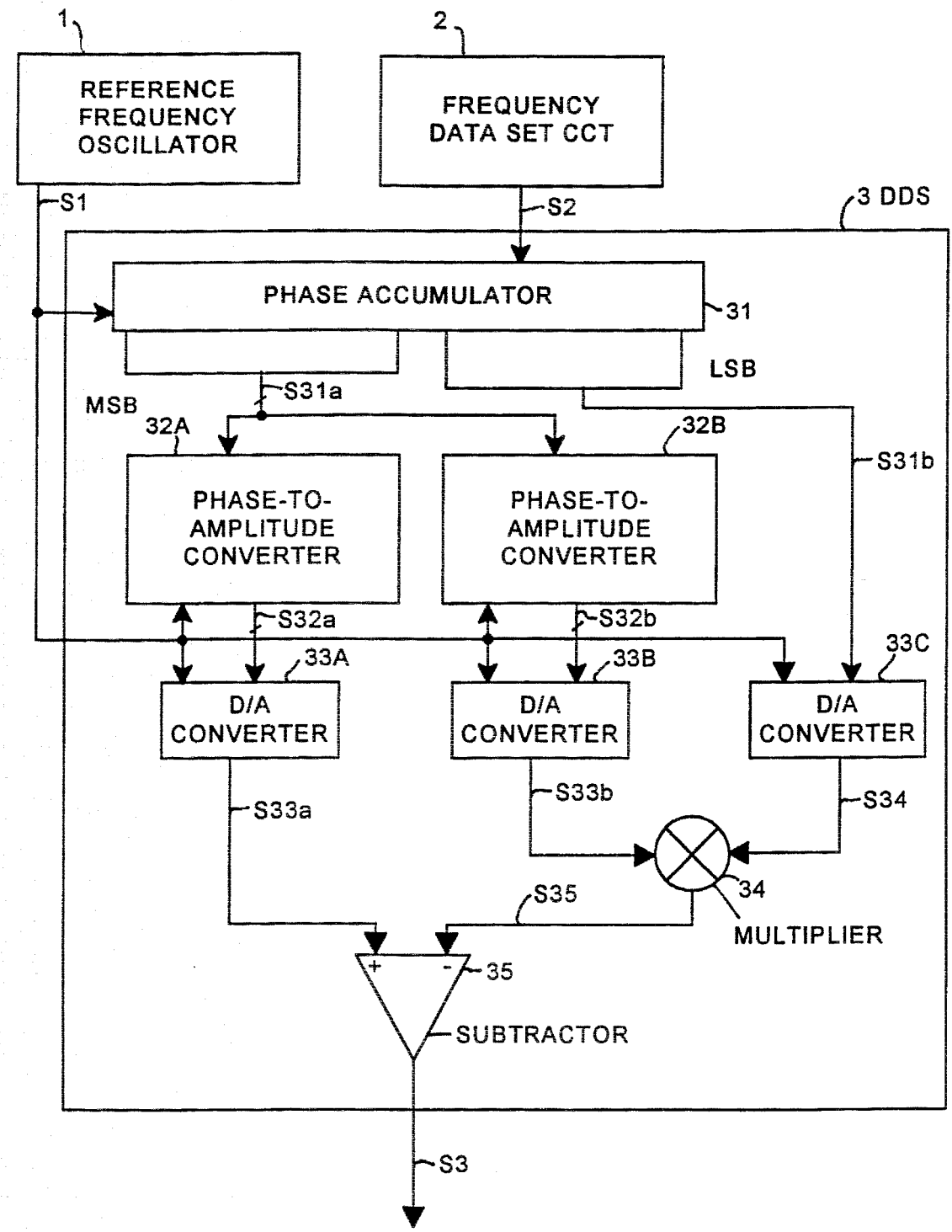
FIG. 2 is a block diagram schematically showing an embodiment of the DDS in accordance with the present invention.

Referring to FIG. 2 showing a first embodiment of the present invention, a DDS 3, comprises a phase accumulator 31 which receives a clock signal S1 from a reference frequency oscillator 1 and frequency data S2 from a frequency data setting circuit 2. In response, the phase accumulator 31 outputs phase data S31. The upper (most significant) bits S31a of the phase data S31 are fed to a phase-to-amplitude converter 32A as an address signal. The phase-to-amplitude converter 32A generates sine amplitude data S32a in accordance with the address signal S32a. A D/A converter 33A converts the sine amplitude data S32a to an analog signal in synchronism with the clock signal S1, thereby producing a sine signal S33a.

In the DDS 3, the most significant bits S31a of the phase data S31 are also applied to a phase-to-amplitude converter 32B as an address signal. In response to the address signal, the phase-to-amplitude converter 32B generates sine amplitude data S32b which is advanced by 90 degrees in phase relative to the sine amplitude data S32a (referred to as cosine amplitude data S32b hereinafter). Therefore, the phase-to-amplitude converter 32B delivers cosine amplitude data. A D/A converter 33B transforms the cosine amplitude data to an analog cosine signal S33b.

Further, the remaining phase data S31 other than the most significant bits S31a, i.e., the lower (less significant) bits S31b are transferred to a D/A converter 33C. The D/A converter 33C produces a phase error signal S34 having an analog value that corresponds to the input less significant bits S31b. It is not necessary to use all of the remaining less significant bits S31b. However, it is preferable to use all the remaining less significant bits since an omitted bit causes a phase error. A multiplier 34 multiplies the cosine signal S33b by the phase error signal S34 to produce a spurious cancel signal S35. A subtracter 35 subtracts the spurious cancel signal S35 from the sine signal S33a. As a result, a sine signal S3 free from spurious noise is the resultant synthesized output from the DDS 3.

The operation of the DDS 3 according to the invention will be described in detail with reference to FIG. 2. The bit length of the phase-to-amplitude converter 32A and that of the D/A converter 33A are smaller than the bit length of the phase accumulator 31. Hence, the sine signal S33a output from the D/A converter 33A contains spurious noise derived from periodic phase errors. Let the sine signal S33a be represented by u(t). Then, u(t) is expressed as:

$$u(t) = \sin\{2\pi ft + A(t)\} \tag{1}$$

where f is a desired frequency (a times greater than $f_o$), and A(t) is a periodic phase error causative of spurious noise and equal to the spurious cancel signal S34. By decomposing the equation (1) by an addition theorem and using a relation (2) shown below, there is obtained an equation (3):

$$A(t) \ll 1 \text{ (radian)} \tag{2}$$

$$u(t) = \sin 2\pi ft + A(t) \cdot \cos 2\pi ft \tag{3}$$

On the other hand, since the cosine signal S33b (represented by v(t)) has a phase term equal to u(t), the following equation (4) holds:

$$v(t) = \cos\{2\pi ft + A(t)\} \tag{4}$$

By decomposing the equation (4) by an addition theorem and using the relation (2), there is produced an equation (5):

$$v(t) = \cos 2\pi ft + A(t) \cdot \sin 2\pi ft \tag{5}$$

Therefore, assuming that the spurious cancel signal S35 from the multiplier 34 is w(t), there is obtained an equation (6):

$$w(t) = v(t) \cdot A(t) \tag{6}$$

Further, assuming that the output of the subtracter 35, i.e., the sine signal S3 output from the DDS 3 is x(t), the following equation (7) is produced:

$$\begin{aligned} x(t) &= u(t) - w(t) \\ &= \{1 + A(t)^2\} \cdot \sin 2\pi ft \end{aligned} \tag{7}$$

Therefore, the sine signal S3 output from the DDS 3 (represented by x(t)) contains only the second order component of the phase error A(t) as a phase error component causative of spurious noise. The sine signal S3 has the spurious noise obviously lower than the conventional sine signal S33a (represented by u(t)) which contains the first order component of the phase error A(t).

While it is not necessary to use all the least significant bits S31b causing the phase error A(t) for the cancellation, relative significant bits should be used in order to reduce the spurious noise of x(t), as stated above.

Figure 3:
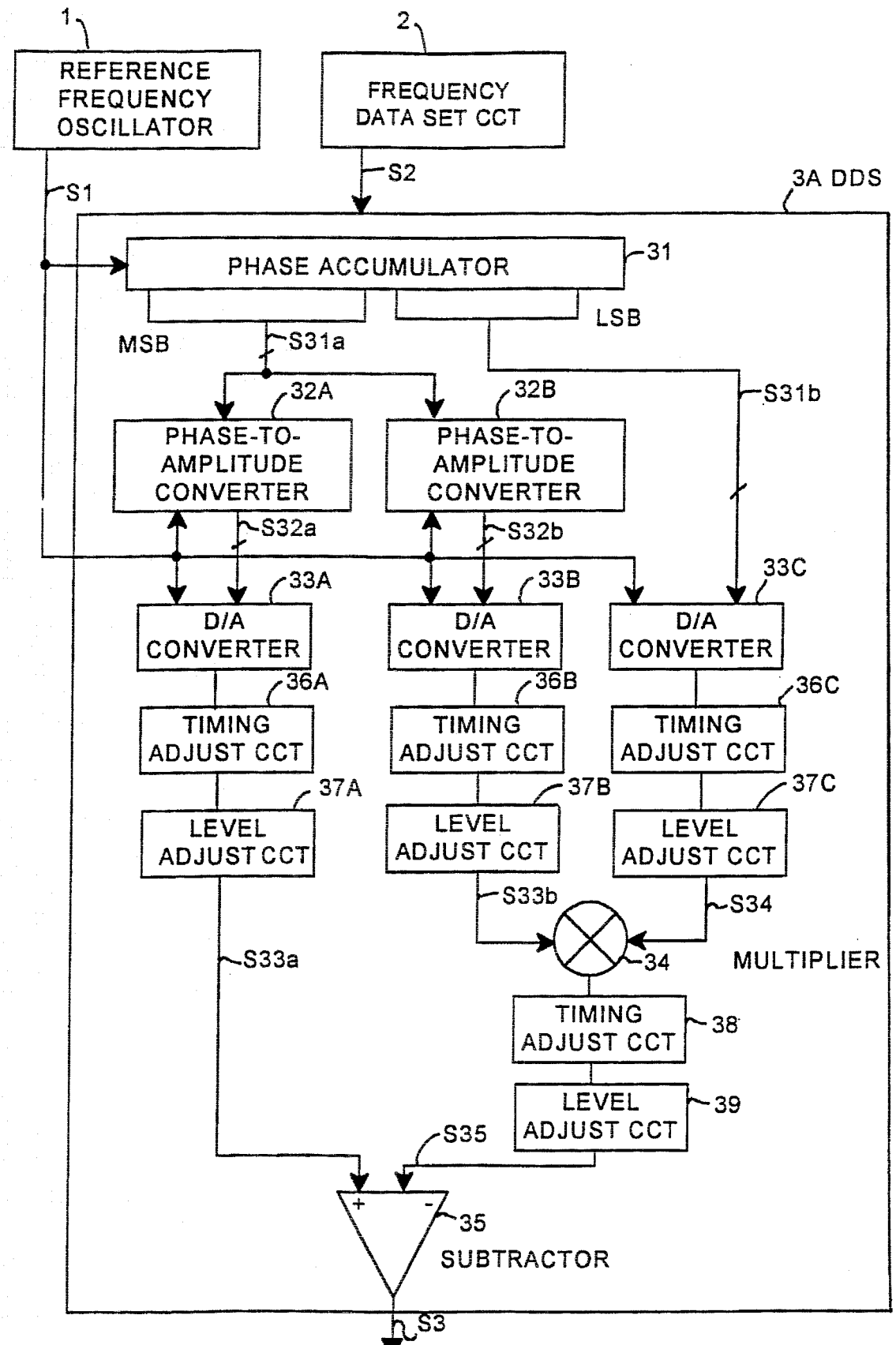
FIG. 3 is a block diagram schematically showing an alternative embodiment of the present invention.

FIG. 3 is a block diagram schematically showing an alternative embodiment of the present invention. In FIG. 3, a DDS 3A has timing adjusting circuits 36A, 36B, 36C and 38 for adjusting the timings (phase) of analog signals, and level adjusting circuits 37A, 37B, 37C and 39 for adjusting the levels (amplitudes) of analog signals, in addition to the constituents of the DDS 3 shown in FIG. 2. Specifically, the timing adjusting circuit 36A and level adjusting circuit 37A are connected between the D/A converter 33A and the + input terminal of the subtracter 35, while the timing adjusting circuit 36B and level adjusting circuit 37B are connected between the D/A converter 33B and one input terminal of the multiplier 34. The timing adjusting circuit 36C and level adjusting circuit 37C are connected between the D/A converter 33C and the multiplier 34. Further, the timing adjusting circuit 38 and level adjusting circuit 39 are connected between the output terminal of the multiplier 34 and the − input terminal of the subtracter 35.

The timing adjusting circuits 36B and 36C respectively correct the deviations of signal timings attributable to the irregularity in the delay characteristics of the D/A converters 33B and 33C. As a result, the cosine signal S33b and the phase error signal S34 are applied to the multiplier 34 substantially at the same timing. The timing adjusting circuits 36A and 38 respectively correct the deviations of the timing of the sine signal S33a from the D/A converter 33A and that of the spurious cancel signal S35 from the multiplier 34, thereby applying the spurious component of the signal S33a and the spurious cancel signal S35 to the subtracter 35 substantially at the same timing. The level adjusting circuits 37B and 37C respectively correct differences in level attributable to the irregularity in the output levels of the D/A converters 33B and 33C. Consequently, the levels of the signals S33b and S34b to be applied to the multiplier 34 are respectively provided with levels adequate for necessary calculations, i.e., satisfying the equations (6) and (7). The level adjusting circuits 37A and 39 respectively adjust the level of the sine signal S33a from the D/A converter 33A and that of the spurious cancel signal S35 from the multiplier 34 such that the spurious component S3 of the sine signal S3 from the subtracter 35 becomes minimum, i.e., satisfies the equation (7).

With this configuration, by adjusting the timings and levels of signals to the multiplier 34 and subtracter 35, the DDS 3A delivers x(t) represented by the equation (7), i.e., the sine signal S3, accurately. This is successful in reducing the spurious noise of the sine signal S3 more than with the DDS 3 of FIG. 2. It is not necessary to use all of the timing adjusting circuits 36A, 36B, 36C and 38 and level adjusting circuits 37A, 37B, 37C and 39. The gist is that they are provided only at necessary portions when the timings and levels of signals to be applied to the multiplier 34 and subtracter 35 differ from required values.

Figure 4:
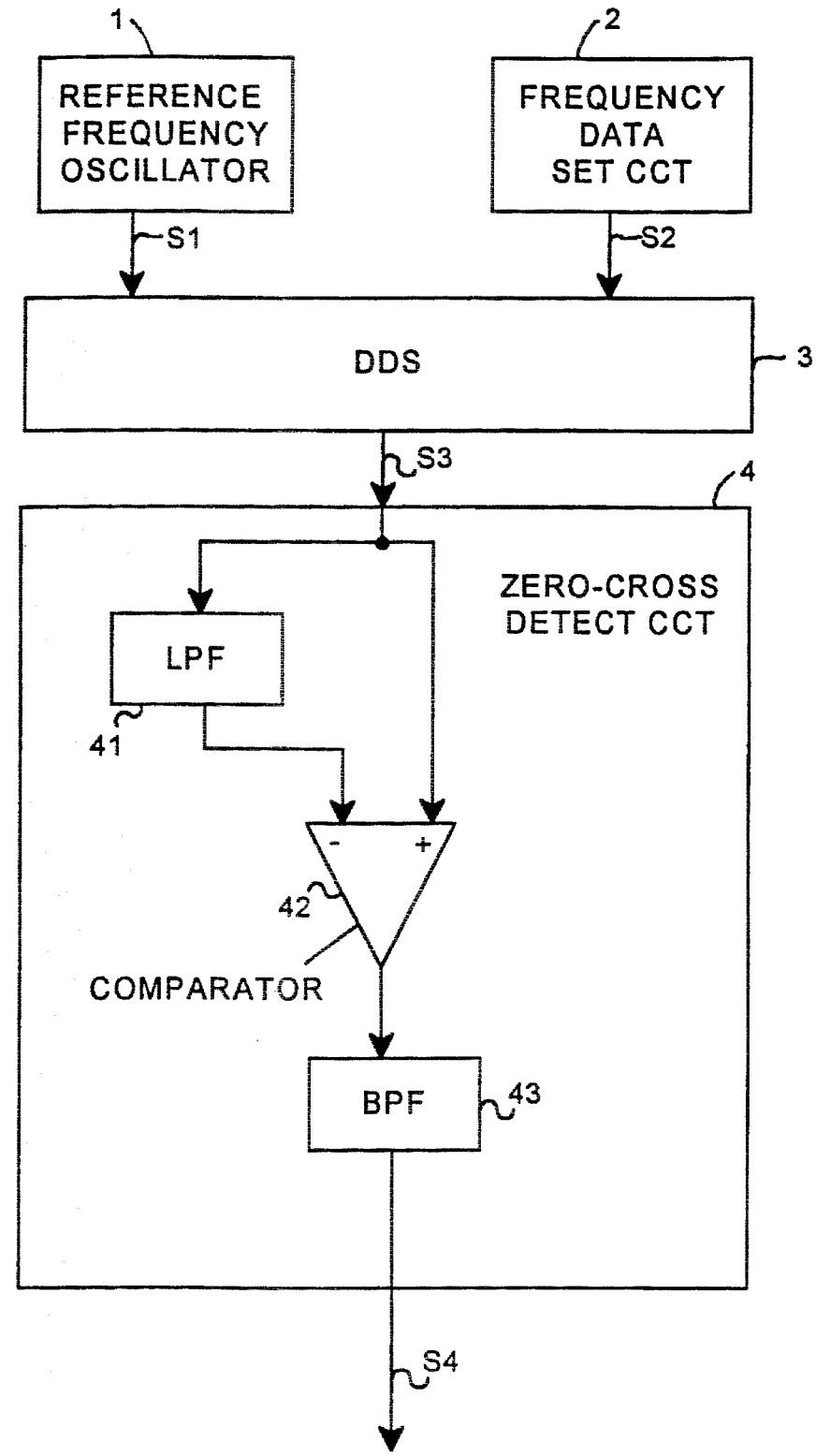
FIG. 4 is a block diagram schematically showing another alternative embodiment of the present invention.

FIG. 4 is a block diagram schematically showing another alternative embodiment of the present invention. As shown, this embodiment is identical with the embodiment of FIG. 2 except that a zero-cross detecting circuit 4 is connected thereto. When the zero-cross detecting circuit 4 detects a zero-crossing point of the sine signal S3 from the DDS 3, it generates a sine wave S4 having a period corresponding to the interval between the detected zero-crossing points and not changing in amplitude during the period. As indicated in the equation (7), the sine signal S3 contains in the amplitude term thereof a spurious component represented by $\{1+ A(t)^2\}$. However, the zero-cross detecting circuit 4 allows the DDS 3 to output a sine signal S4 entirely free from spurious components attributable to the amplitude term.

Specifically the zero-cross detecting circuit 4 has a low pass filter (LPF) 41 which filters out a DC component (offset voltage) usually included in the sine signal S3. When the signal S3 does not include any DC component, the LPF 41 is not necessary; the − input terminal of the comparator 42 will be set at zero volt. A comparator 42 compares the sine signal S3 and DC component so as to output a rectangular waveform signal whose period is equal to the period of the signal S3. In the rectangular wave signal, changes in the amplitude of the sine signal S3 during the period and attributable to the spurious noise of the signal S3 have been removed. The rectangular waveform signal is filtered by a band pass filter (BPF) 43 to turn out a sine signal S4 free from spurious noise. The rectangular waveform signal may be produced as an output signal of the DDS 3, if desired.

As described above, the DDS according to the present invention can generate the spurious noise-free output signal by using a cosine signal produced on the basis of the most significant bits and a phase error signal produced on the basis of the less significant bits of the accumulator and thereby synthesizing a spurious cancel signal.

What is claimed is:

1. A direct digital synthesizer comprising:

means accumulating frequency data to produce phase data;

means responsive to said phase data from said accumulating means producing predetermined trigonometric function data;

digital-to-analog converting means converting said predetermined trigonometric function data into an analog trigonometric function signal;

means responsive to said phase data from said accumulating means producing an analog spurious canceling signal; and means combining said analog trigonometric function signal and said analog spurious canceling signal to produce a resultant analog synthesized signal.

2. A direct digital synthesizer as claimed in claim 1, wherein said predetermined trigonometric function data producing means produces said predetermined trigonometric function data in response to significant bits of said phase data, said spurious canceling signal producing means includes means for producing phase-advanced trigonometric function data in response to said significant bits of said phase data, said phase-advanced trigonometric function data being phase-advanced relative to said predetermined trigonometric function data, means producing phase error data in response to less significant bits of said phase data, digital-to-analog converting means converting said phase-advanced trigonometric function data into an analog phase-advance trigonometric function signal, and digital-to-analog converting means converting said error data into an analog phase error signal, and means multiplying said analog phase-advanced trigonometric function signal and said analog phase error signal to produce said analog spurious canceling signal.

3. A direct digital synthesizer comprising:

phase accumulator means accumulating frequency data to produce phase data;

a first phase-to-analog converter for generating sine amplitude data corresponding to the value of said significant bits;

a first digital-to-analog converter for converting said sine amplitude data into an analog sine signal;

a second digital-to-analog converter for converting said cosine amplitude data into an analog cosine signal;

an error data converter for converting less significant bits of said phase data into phase error data;

a third digital-to-analog converter for converting said phase error data into an analog phase error signal;

a multiplier for multiplying said analog cosine signal and said analog phase error signal to produce an analog spurious cancel signal; and a subtracter for subtracting said analog spurious cancel signal from said analog sine signal to produce a resultant analog synthesized signal.

4. A direct digital synthesizer comprising:

phase accumulator means accumulating frequency data to produce phase data;

phase-to-sine signal converting means generating a sine signal in response to significant bits of said phase data, said phase-to-sine signal converting means including a first phase-to-amplitude converter for generating sine amplitude data corresponding to the value of said significant bits, and a second converter for converting said sine amplitude data into said sine signal;

phase-to-cosine signal converting means generating a cosine signal, which is advanced in phase by 90 degrees relative to said sine signal, in response to said significant bits, said phase-to-cosine signal converting means including a second phase-to-amplitude converter for generating cosine amplitude data corresponding to the value of said significant bits, and a third converter for converting said cosine amplitude data into said cosine signal;

a first converter for converting less significant bits of said phase data into a phase error signal;

a multiplier for multiplying said cosine signal and said phase error signal to produce a spurious cancel signal;

a subtracter for subtracting said spurious cancel signal from said sine signal to produce a resultant synthesized signal;

a first timing adjusting circuit for causing said cosine signal and said phase error signal to arrive at input terminals of said multiplier substantially at the same timing;

a first level adjusting circuit for confining signal levels of said cosine signal and said phase error signal on said input terminals of multiplier in a predetermined range necessary for said multiplier;

a second timing adjusting signal for causing a spurious component of said sine signal and said spurious cancel signal to arrive at input terminals of said subtracter at substantially the same time; and a second level adjusting circuit for setting said sine signal and said spurious cancel signal on said input terminals of said subtracter at respective signal levels which minimize said spurious component of said resultant synthesized signal.

5. A direct digital synthesizer comprising:

phase accumulator means accumulating frequency data to produce phase data;

phase-to-sine signal converting means generating a sine signal in response to significant bits of said phase data;

phase-to-cosine signal converting means generating a cosine signal, which is advanced in phase by 90 degrees relative to said sine signal, in response to said significant bits;

a first converter for converting less significant bits of said phase data into a phase error signal;

a multiplier for multiplying said cosine signal and said phase error signal to produce a spurious cancel signal;

a subtracter for subtracting said spurious cancel signal from said sine signal to produce a resultant synthesized signal; and zero-cross detecting means generating, on detecting a zero-crossing point of said resultant synthesized signal, an iterative signal having a period corresponding to an interval between detected zero-crossing points.

6. A digital frequency synthesizer as claimed in claim 5, wherein said zero-cross detecting means comprises a low pass filter for filtering out a DC component contained in said resultant synthesized signal, and a comparator for comparing said resultant synthesized signal and said DC component to thereby produce said iterative signal.

* * * * *